United States Patent
Urai

(10) Patent No.: US 8,238,103 B2
(45) Date of Patent: Aug. 7, 2012

(54) ELECTRONIC COMPONENT UNIT AND COUPLING MECHANISM

(75) Inventor: Takashi Urai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 35 days.

(21) Appl. No.: 12/467,198

(22) Filed: May 15, 2009

(65) Prior Publication Data
US 2010/0020498 A1 Jan. 28, 2010

(30) Foreign Application Priority Data
Jul. 23, 2008 (JP) ................................. 2008-189324

(51) Int. Cl.
*H05K 7/20* (2006.01)
*H01L 23/40* (2006.01)

(52) U.S. Cl. ... 361/710; 361/709; 361/719; 361/679.54; 165/80.2; 165/80.3; 257/727

(58) Field of Classification Search .................. 361/707, 361/709, 719, 679.54; 29/700; 257/727; 165/80.2, 80.3
See application file for complete search history.

(56) References Cited

U.S. PATENT DOCUMENTS

| | | | | |
|---|---|---|---|---|
| 4,167,771 A | * | 9/1979 | Simons | 361/715 |
| 4,500,945 A | * | 2/1985 | Lipschutz | 361/715 |
| 4,628,990 A | * | 12/1986 | Hagihara et al. | 165/80.4 |
| 4,753,287 A | * | 6/1988 | Horne | 165/80.3 |
| 5,552,961 A | * | 9/1996 | Van Gaal et al. | 361/700 |
| 5,705,422 A | | 1/1998 | Yee | |
| 5,754,400 A | * | 5/1998 | Sathe et al. | 361/704 |
| 5,901,039 A | * | 5/1999 | Dehaine et al. | 361/704 |
| 6,214,647 B1 | * | 4/2001 | Di Giacomo et al. | 438/122 |
| 6,356,445 B1 | * | 3/2002 | Mochzuki et al. | 361/697 |
| 6,501,658 B2 | * | 12/2002 | Pearson et al. | 361/709 |
| 6,826,054 B2 | * | 11/2004 | Liu | 361/719 |
| 6,920,052 B2 | * | 7/2005 | Callahan et al. | 361/767 |
| 7,161,808 B2 | * | 1/2007 | Atkinson | 361/719 |
| 7,164,587 B1 | * | 1/2007 | Garnett et al. | 361/799 |
| 7,180,743 B2 | * | 2/2007 | Chen et al. | 361/704 |
| 7,283,368 B2 | * | 10/2007 | Wung et al. | 361/719 |
| 7,474,532 B1 | * | 1/2009 | Desrosiers et al. | 361/719 |
| 7,729,122 B2 | * | 6/2010 | Wong | 361/710 |
| 7,869,217 B2 | * | 1/2011 | Chen et al. | 361/710 |
| 7,870,888 B2 | * | 1/2011 | Zhou et al. | 165/80.3 |
| 2005/0117305 A1 | * | 6/2005 | Ulen et al. | 361/719 |
| 2007/0030656 A1 | * | 2/2007 | Ross et al. | 361/710 |

FOREIGN PATENT DOCUMENTS

| | | |
|---|---|---|
| JP | 10-004147 A | 1/1998 |
| JP | 2004-071665 A | 3/2004 |

\* cited by examiner

*Primary Examiner* — Anatoly Vortman
(74) *Attorney, Agent, or Firm* — Fujitsu Patent Center

(57) ABSTRACT

An electronic component unit includes: a substrate; an electronic component mounted on the surface of the substrate; a heat dissipating member received on the electronic component; a cylinder member having one end coupled to the substrate, the cylinder member having the other end defining an opening opposed to the heat dissipating member; and a piston member having one end coupled to the heat dissipating member, the piston member having the other end inserted in the cylinder member through the opening to establish a closed decompressed space inside the cylinder member.

5 Claims, 11 Drawing Sheets

US 8,238,103 B2

ELECTRONIC COMPONENT UNIT AND COUPLING MECHANISM

CROSS-REFERENCE TO RELATED APPLICATION

This application is based upon and claims the benefit of priority from the prior Japanese Patent Application No. 2008-189324 filed on Jul. 23, 2008, the entire contents of which are incorporated herein by reference.

FIELD

The embodiments discussed herein are related to an electronic component unit including a substrate; and a coupling mechanism of the electronic component.

BACKGROUND

An electronic component unit is incorporated in an electronic apparatus such as a server computer. The electronic component unit includes a large-scale integrated circuit (LSI) chip package mounted on a substrate of a system board. A heat sink is received on the LSI chip package. Four bolts are utilized to couple the heat sink to the substrate of the system board, for example. The bolts penetrate the base plate of the heat sink and the substrate of the system board. The tip ends of the bolts are screwed into a bolster plate overlaid on the backside of the substrate. A coil spring is interposed between the head of each bolt and the base plate. The coil spring exhibits an elastic force forcing the head of the bolt to be distanced from the base plate. The base plate is thus urged against the LSI chip package.

A predetermined urging force is ensured for keeping a reliable contact between the base plate of the heat sink and the LSI chip package. The bolt is screwed into the bolster plate to fix the heat sink on the substrate of the system board. A tool such as a torque driver is utilized to screw the bolt into the bolster plate. The urging force is adjusted based on the amount how much the bolt is screwed into the bolster plate. For example, it is required to attach/detach the bolt for the maintenance work at a spot where the server computer has been placed. The attachment/detachment of the bolt with a tool is time consuming.

[Patent Document 1] Japanese Laid-open Patent Publication No. 2004-71665

[Patent Document 2] Japanese Laid-open Patent Publication No. 10-4175

SUMMARY

According to an aspect of the present invention, an electronic component unit includes: a substrate; an electronic component mounted on the surface of the substrate; a heat dissipating member received on the electronic component; a cylinder member having one end coupled to the substrate, the cylinder member having the other end defining an opening opposed to the heat dissipating member; and a piston member having one end coupled to the heat dissipating member, the piston member having the other end inserted in the cylinder member through the opening to establish a closed decompressed space inside the cylinder member.

The object and advantages of the embodiment will be realized and attained by means of the elements and combinations particularly pointed out in the appended claims. It is to be understood that both the foregoing general description and the following detailed description are exemplary and explanatory and are not restrictive of the embodiment, as claimed.

DESCRIPTION OF EMBODIMENTS

An embodiment of the present invention will be explained below with reference to the accompanying drawings.

Figure 1:
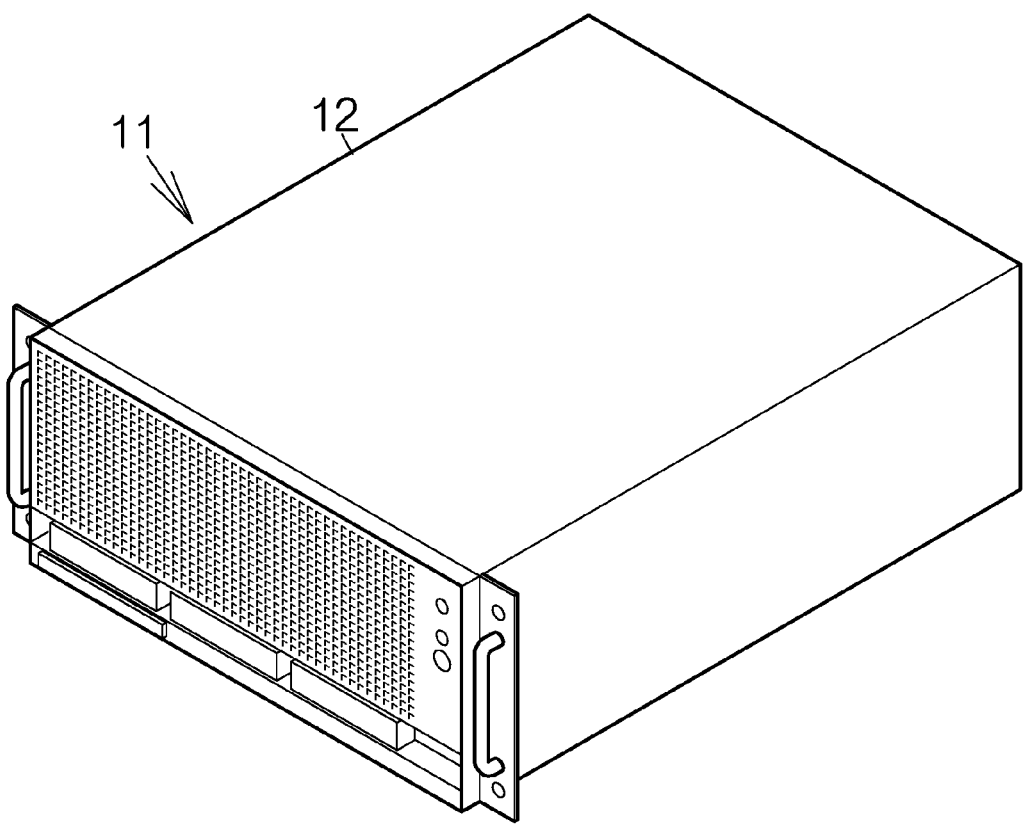
FIG. 1 is a perspective view schematically illustrating a sever computer apparatus as an electronic apparatus according to an embodiment.

FIG. 1 schematically illustrates a server computer apparatus 11 as an example of an electronic apparatus according to an embodiment. The server computer apparatus 11 includes a box-shaped enclosure 12 defining an inner space, for example. An electronic component unit, namely a system board, is placed in the box-shaped enclosure 12. The system board includes an electronic component such as a semiconductor chip and a main memory, for example. The semiconductor chip executes various kinds of processing based on software programs and/or data temporarily held in the main memory, for example. The software programs and/or data may be stored in a mass storage such as a hard disk drive (HDD) likewise placed in the box-shaped enclosure 12. The server computer apparatus 11 is mounted on a rack, for example.

Figure 2:
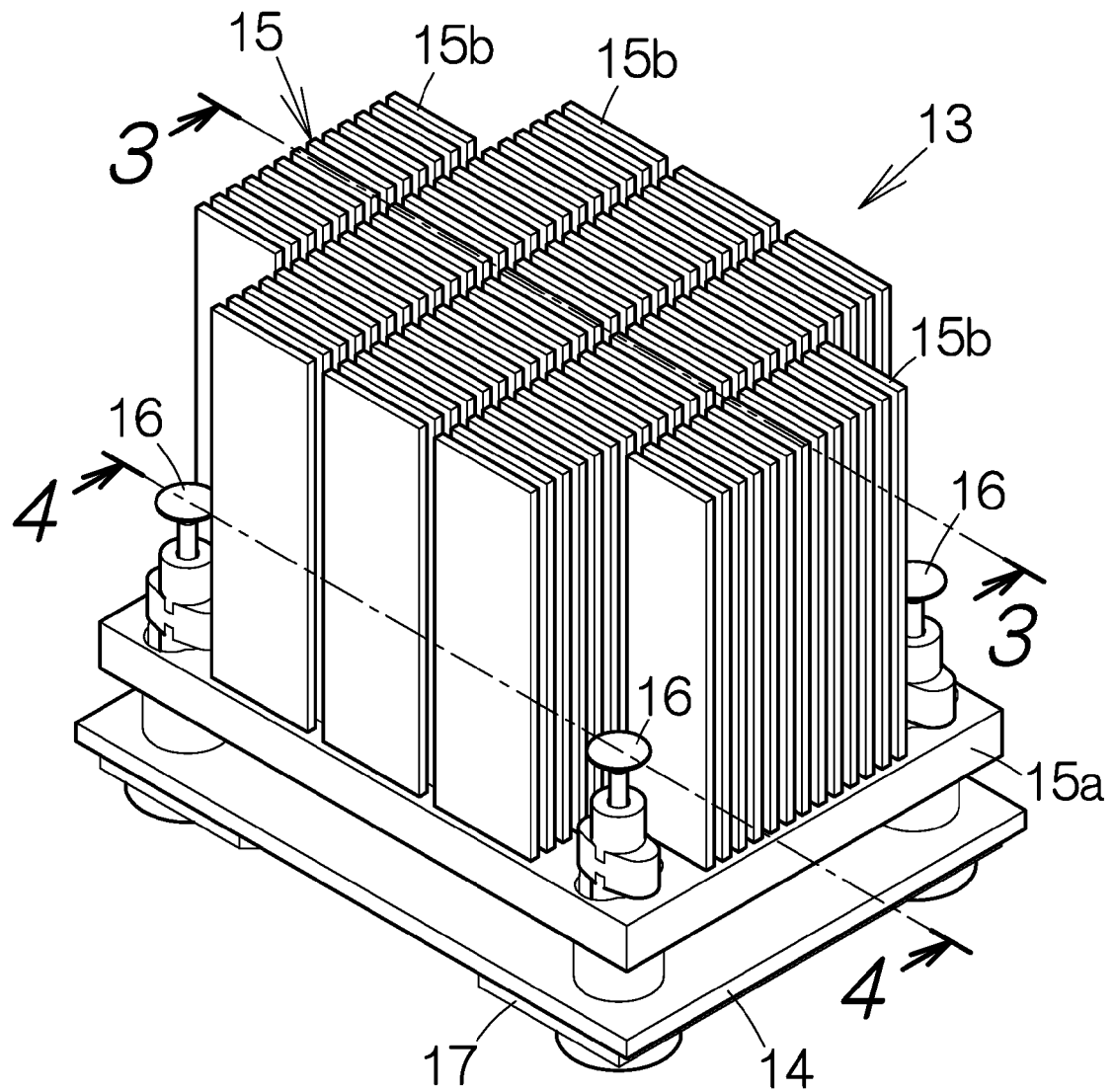
FIG. 2 is a perspective view schematically illustrating a system board as an electronic component unit according to an embodiment.

FIG. 2 schematically illustrates a system board 13 as a specific example of an electronic component unit according to an embodiment. The system board 13 includes a substrate with printed electrically-conductive patterns, namely a printed wiring board 14. A substrate made of resin is utilized in the printed wiring board 14, for example. The printed wiring board 14 has a polygonal contour. Here, the printed wiring board 14 has a rectangular contour. A large-scale integrated circuit (LSI) chip package is mounted on the front surface of the printed wiring board 14. The LSI chip package will be described later in detail.

A heat dissipating member, namely a heat sink 15, is receive on the LSI chip package. The heat sink 15 includes a base plate 15a in the shape of a flat plate. The flat lower surface of the base plate 15a is overlaid on the upper surface of the LSI chip package. Fins 15b are fixed to the base plate 15a. The individual fin 15b stands upright from the upper surface of the base plate 15a. The fins 15b extend in rows in parallel with one another. Parallel air passages are defined between the adjacent ones of the fins 15b. The base plate 15a and the fins 15b may be made of a metallic material such as aluminum or copper.

The heat sink 15 is coupled to the printed wiring board 14. The heat sink 15 and the printed wiring board 14 correspond to either one of the first and second objects according to the claimed embodiment, respectively. Four coupling mechanisms 16 are utilized to couple the heat sink 15, for example. The coupling mechanisms 16 are placed near the corners of the base plate 15a, respectively. The coupling mechanisms 16 penetrate the base plate 15a and the printed wiring board 14. A plate member, namely a bolster plate 17, is placed on the backside of the printed wiring board 14. The bolster plate 17 is overlaid on the back surface of the printed wiring board 14. The bolster plate 17 is made of a metallic material such as stainless steel. The coupling mechanisms 16 serve to urge the base plate 15a against the LSI chip package. The coupling mechanisms 16 will be described later in detail.

Figure 3:
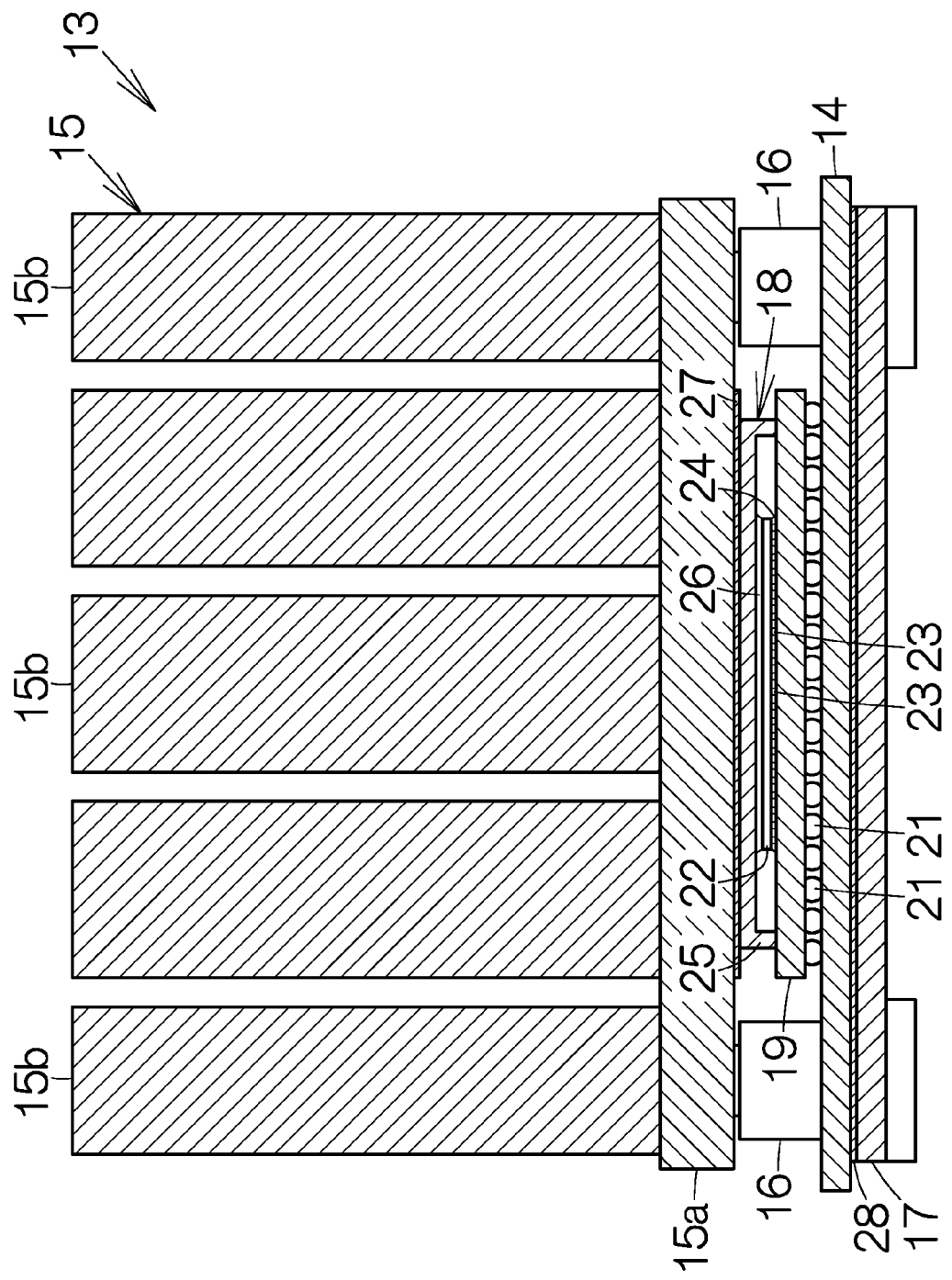
FIG. 3 is a sectional view taken along the line 3-3 in FIG. 2.

As depicted in FIG. 3, an LSI chip package 18 is mounted on the front surface of the printed wiring board 14. The LSI chip package 18 includes a package substrate 19. The package substrate 19 is a ceramic substrate, for example. The package substrate 19 has a polygonal contour. Here, the package substrate 19 bas a rectangular contour. Terminal bumps 21, namely ball grid array (BGA) balls, are placed on the front surface of the printed wiring board 14 inside the contour of the package substrate 19. The terminal bumps 21 are made of a solder material. The solder material may be a lead-free solder, for example. The lead-free solder is a Sn—Ag—Cu alloy, for example. The package substrate 19 is received on the terminal bumps 21. The terminals bumps 21 serve to bond the package substrate 19 to the front surface of the printed wiring board 14. The terminal bumps 21 form a terminal bump group.

An LSI chip 22 is mounted on the surface of the package substrate 19. The LSI chip 22 has a rectangular contour, for example. Terminal bumps 23 are arranged in a matrix on the surface of the package substrate 19. The LSI chip 22 is received on the terminal bumps 23. Input/output signal lines are formed in the LSI chip 22. The individual input/output signal line is connected to the terminal bump 23. The external terminals of the input/output signal lines are in this manner established outside the LSI chip 22. The terminal bumps 23 are sealed on the package substrate 19. Specifically, a space between the LSI chip 22 and the package substrate 19 is filled with a resin material 24. Electronic components such as a chip capacitor and a chip resistor may also be mounted on the package substrate 19.

A heat conductive member, namely a heat spreader 25, is received on the surface of the package substrate 19. The heat spreader 25 is made of a metallic material such as copper. The heat spreader 25 is in contact with the surface of the LSI chip 22. A bonding material, namely a solder material 26, is utilized to braze the surface of the LSI chip 22 to the lower surface of the heat spreader 25. The thermal energy of the LSI chip 22 is in this manner transferred to the heat spreader 25 with efficiency. A thermal sheet 27 is interposed between the heat spreader 25 and the base plate 15a of the heat sink 15. The thermal energy of the LSI chip 22 is thus transferred to the heat sink 15. The thermal energy is allowed to dissipate into the air from the heat sink 15. An insulating sheet 28 is interposed between the printed wiring board 14 and the bolster plate 17.

Figure 4:
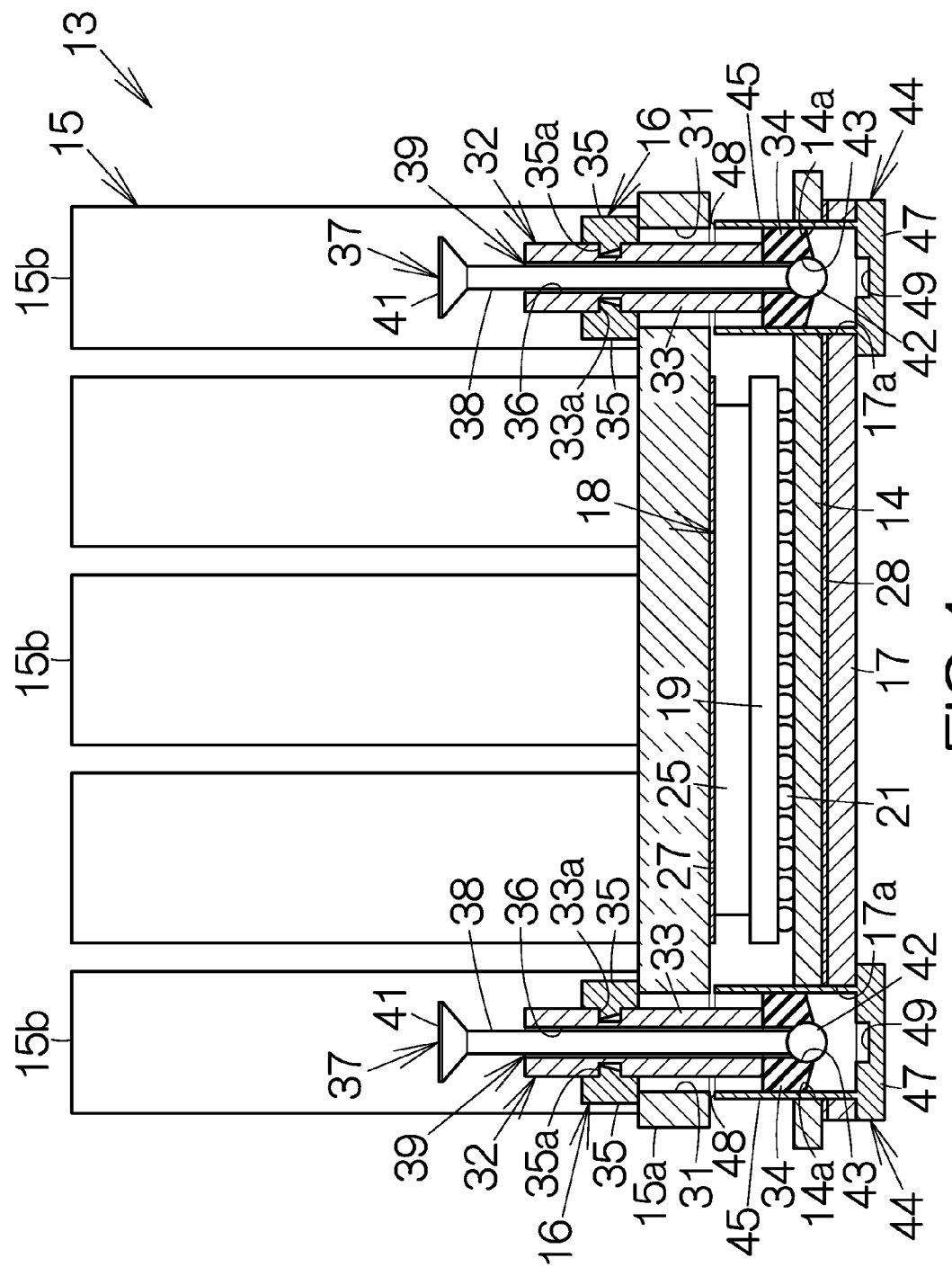
FIG. 4 is a sectional view taken along the line 4-4 in FIG. 2.

As depicted in FIG. 4, the individual coupling mechanism 16 includes a piston member 32 received in a through hole 31 formed in the base plate 15a. The piston member 32 includes a shaft 33 having a hollow space extending along the longitudinal axis of the shaft 33, for example. The shaft 33 is made of a resin material, for example. A columnar piston 34 is fixed to one end, namely the lower end, of the shaft 33, for example. The piston 34 is made of an elastic body such as rubber, for example. The diameter of the piston 34 is set larger than the diameter of the shaft 33. The diameter of the through hole 31 is set larger than the diameter of the piston 34. The piston 34 can thus be received in the through hole 31.

Figure 5:
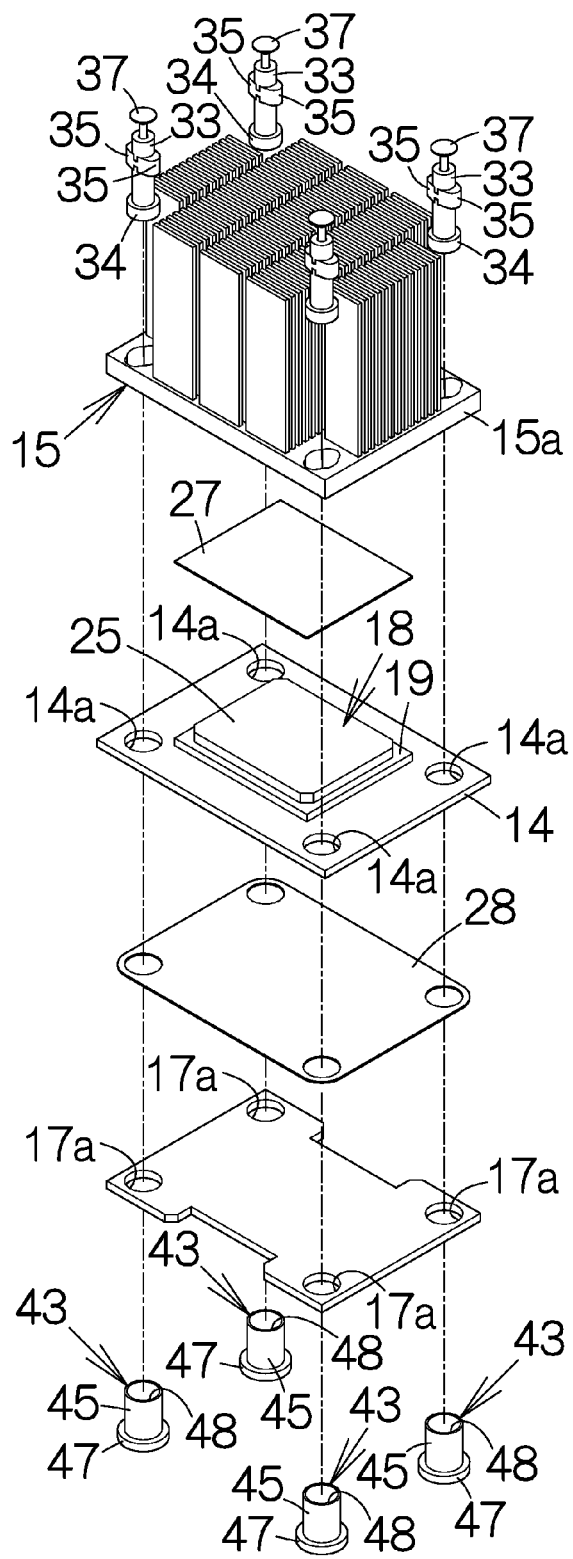
FIG. 5 is an exploded view schematically illustrating the system board.

Referring also to FIG. 5, the shaft 33 has a pair of protrusions 35 protruding from the outer peripheral surface of the shaft 33. The protrusions 35 are received on the upper surface of the base plate 15a around the through hole 31. The protrusions 35 protrude from the shaft 33 in the opposite directions from each other. The protrusions 35, 35 are connected to each other with a ring 35a extending around the shaft 33. The ring 35a is received in a groove 33a formed in the outer peripheral surface of the shaft 33 coaxially with the longitudinal axis of the shaft 33. The protrusions 35, 35 are thus rotatable relative to the shaft 33 and the piston 34 around the longitudinal axis of the shaft 33. The protrusions 35 and the ring 35a are formed in a one piece component, for example. The one piece component made of a resin material, for example. Molding process is employed to make the one piece component. The piston 34 and the protrusions 35 are spaced from each other at a predetermined distance.

The piston member 32 includes a through hole 36 penetrating the shaft 33 and the piston 34. The through hole 36 defines a columnar space extending along the longitudinal axis of the shaft 33. The piston member 32 includes a stopple member 37 received in the through hole 36, for example. The stopple member 37 includes a pin 38 having a diameter smaller than the diameter of the through hole 36. An air passage 39 is established around the pin 38 inside the through hole 36. A flange 41 is formed at one end, namely the upper end, of the pin 38. The flange 41 has a diameter larger than the diameter of the through hole 36. A spherical stopple 42 is fixed to the other end, namely the lower end, of the pin 38. The spherical stopple 42 is airtightly fitted in a depression 43 formed in the lower end of the piston 34. The spherical stopple 42 is made of an elastic material such as rubber. The depression 43 defines an inner space in the form of a partial sphere. The partial sphere is slightly larger than the hemisphere having an opening slightly smaller than the maximum cross-section of the sphere. The spherical stopple 42 is thus reliably held in the depression 43.

The individual coupling mechanism 16 includes a cylinder member 44 associated with the piston member 32. The cylinder member 44 includes a cylinder body 45 defining a columnar inner space. The cylinder body 45 is received in a through hole 14a of the printed wiring board 14 and a through hole 17a of the bolster plate 17. A flange 47 is formed at one end, namely the lower end, of the cylinder body 45. The flange 47 is received on the back or lower surface of the bolster plate 17. Here, the cylinder member 44 may be fixed to the bolster plate 17 with an adhesive, for example. The columnar inner space is closed at the lower end of the cylinder body 45. The columnar inner space is open at an opening 48 formed at the other end, namely the upper end, of the cylinder body 45. A recess 49 is formed in the bottom plate of the cylinder body 45. The recess 49 is sufficiently large in size to accept the aforementioned spherical stopple 42 therein.

The piston member 32 is inserted in the inner space of the cylinder member 44 through the opening 48. The piston 34 is airtightly received in the inner space of the cylinder member 44. The piston 34 is movable inside the cylinder member 44 along the central axis of the inner space. The spherical stopple 42 of the stopple member 37 is airtightly fitted in the depression 43 of the piston 34. A closed space is thus established in the cylinder member 44 below the piston 34 of the piston member 32. Here, the closed space is a decompressed space having an air pressure lower than the atmospheric pressure. The decompressed space serves to draw the piston member 32 toward the bottom of the cylinder body 45. The base plate 15a of the heat sink 15 is thus urged against the LSI chip package 18.

Figure 6:
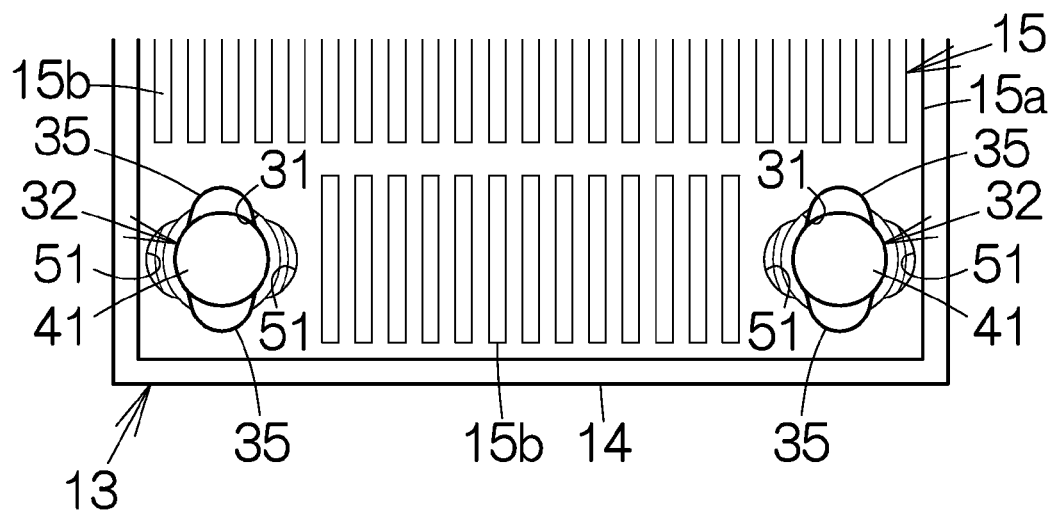
FIG. 6 is a partial plan view schematically illustrating protrusions received on a base plate.
Figure 7:
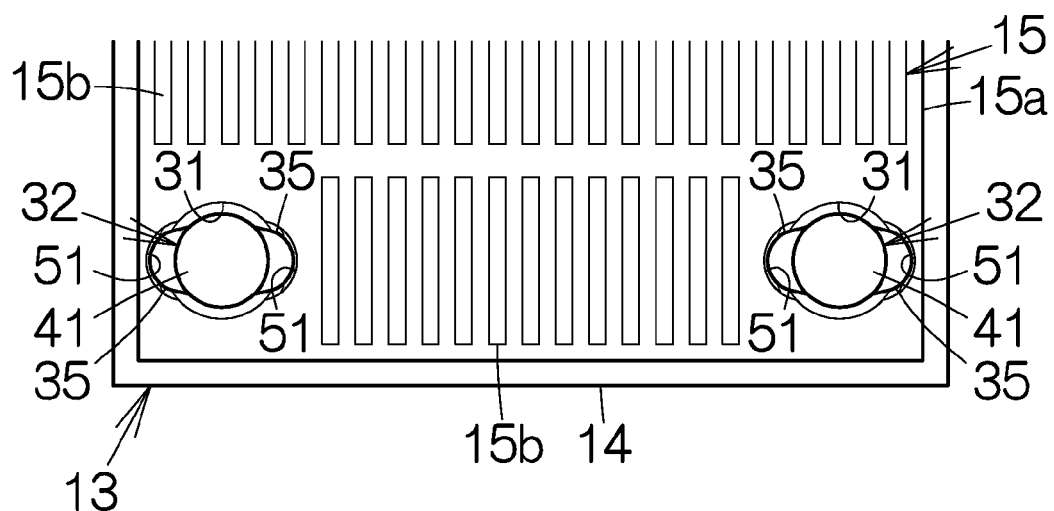
FIG. 7 is a partial plan view schematically illustrating the protrusions received in depressions of through holes formed in the base plate.

As depicted in FIG. 6, the central axis of the through hole 31 of the base plate 15a aligned with the longitudinal axis of the piston member 32. A pair of depressions 51, 51 is formed in the inner wall surface of the through hole 31. The depressions 51, 51 extend in parallel with each other along the central axis of the through hole 31 at the opposite ends of the diameter. The protrusions 35, 35 of the piston member 32 are received on the upper surface of the base plate 15a between the depressions 51, 51 on an imaginary circle coaxial with the central axis of the through hole 31. As depicted in FIG. 7, when the protrusions 35, 35 are rotated around the longitudinal axis of the shaft 33 by a rotation angle of 90 degrees, for example, for establishment of a predetermined pivotal position, the protrusions 35, 35 are received in the depressions 51, 51, respectively. The shaft 33 and the piston 34 are thus movable along their longitudinal axes inside the through hole 31.

Figure 8:
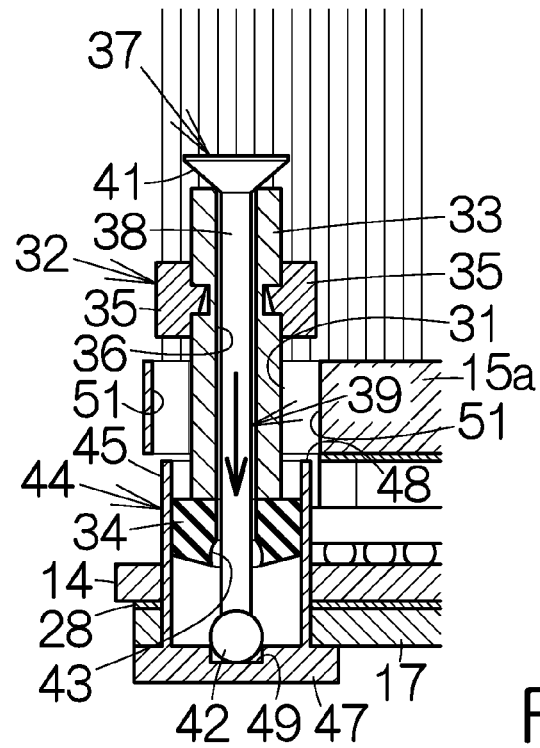
FIG. 8 is a partial sectional view, corresponding to FIG. 4, schematically illustrating a stopple member set at the lowermost position when a piston is set at the uppermost position.

Next, description will be made on a method of attaching the heat sink 15. The LSI chip package 18 has been mounted on the front surface of the printed wiring board 14. The bolster plate 17 is overlaid on the back surface of the printed wiring board 14. The cylinder members 44 are fixed to the bolster plate 17. The base plate 15a of the heat sink 15 is placed on the LSI chip package 18. As depicted in FIG. 8, each of the piston members 32 is inserted in the corresponding through hole 31 from the upper surface of the base plate 15a. The piston 34 is airtightly received in the cylinder member 44. Here, the pin 38 has been pushed down relative to the shaft 33 so that the spherical stopple 42 is dropped out of the depression 43 of the piston 34. The air passage 39 serves to connect the outside space to the space between the piston 34 and the bottom of the cylinder body 45. The stopple member 37 is pushed down to the lowermost position while the shaft 33 is kept at the uppermost position. The spherical stopple 42 is received in the recess 49 of the cylinder member 44.

Figure 9:
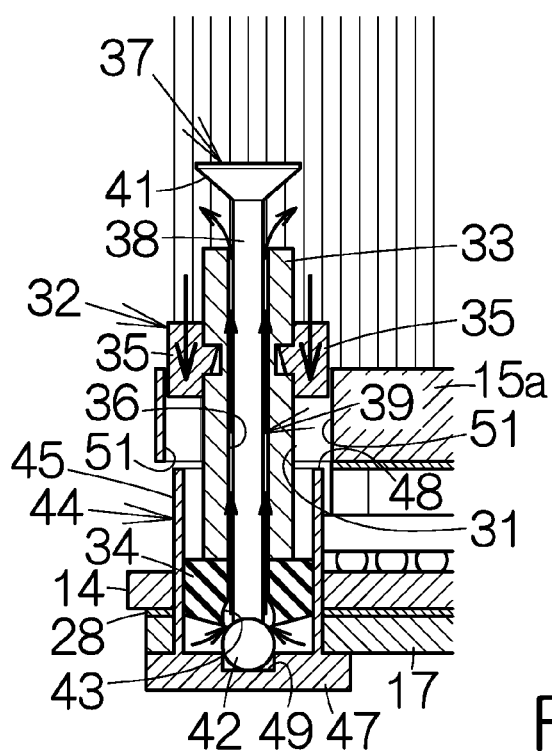
FIG. 9 is a partial sectional view, corresponding to FIG. 4, schematically illustrating the piston pushed down to the lowermost position when the stopple member is set at the lowermost position.
Figure 10:
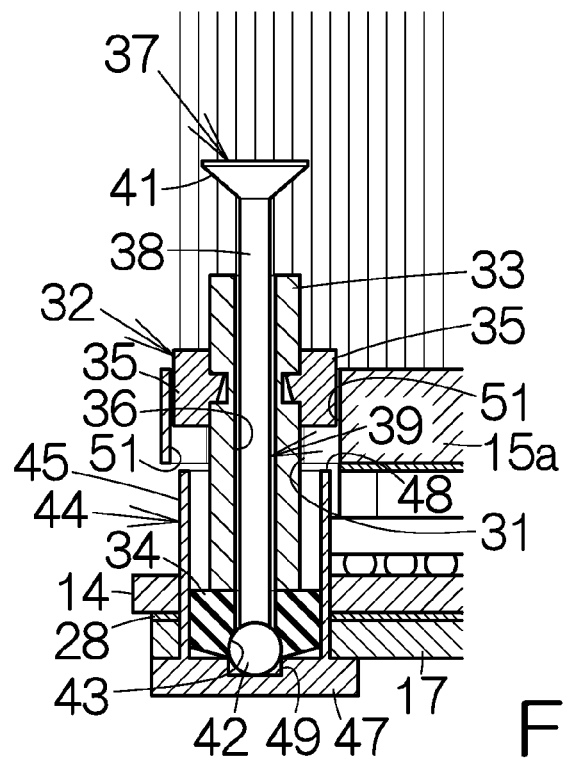
FIG. 10 is a partial sectional view, corresponding to FIG. 4, schematically illustrating the piston set at the lowermost position when the stopple member is set at the lowermost position.

The protrusions 35, 35 are set at the predetermined pivotal position. In this case, as depicted in FIG. 9, the shaft 33 and the piston 34 are pushed down to the lowermost position while the stopple member 37 is kept at the lowermost position. The protrusions 35 are received in the depressions 51 of the through hole 31. Since the air passage 39 is keep connecting the outside space to the space between the piston 34 and the bottom of the cylinder body 45, the downward movement of the piston 34 serves to drive air into the outside space from the space between piston 34 and the bottom of the cylinder body 45 through the air passage 39. When the shaft 33 reaches the lowermost position, as depicted in FIG. 10, the spherical stopple 42 is airtightly fitted in the depression 43 of the piston 34. The flow passage 39 is thus closed. A closed space is established between the cylinder member 44 and the piston 34. Since the spherical stopple 42 is fitted in the recess 49, residual air is minimized in the space defined between the piston 34 and the bottom of the cylinder body 45.

Figure 11:
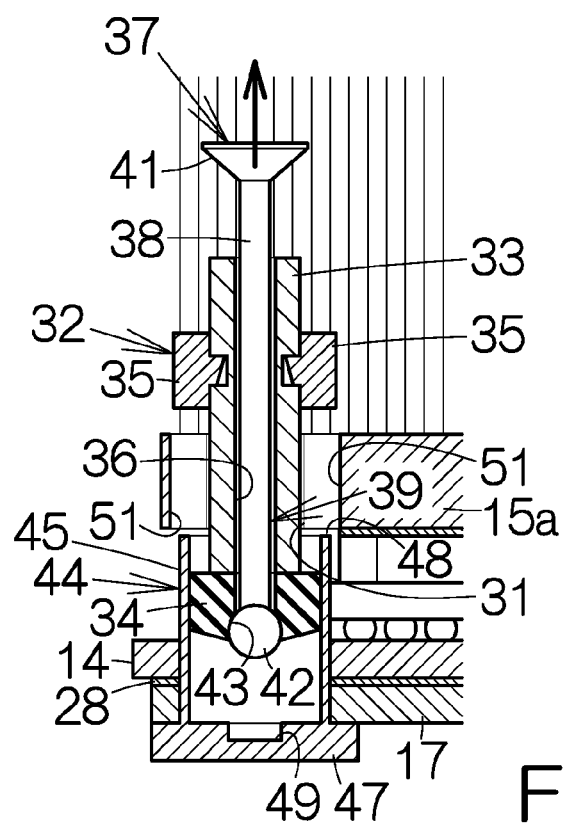
FIG. 11 is a partial sectional view, corresponding to FIG. 4, schematically illustrating the piston member lifted up to the uppermost position.

As depicted in FIG. 11, the stopple member 37 is lifted up to the uppermost position. Since the spherical stopple 42 is airtightly fitted in the depression 43 of the piston 34, the upward movement of the stopple member 37 causes the upward movement of the shaft 33 and the piston 34 to the uppermost position. The protrusions 35, 35 are positioned above the upper surface of the base plate 15a. The air pressure is gradually reduced in the space defined between the cylinder member 44 and the piston 34 during the upward movement of the piston member 32. In this manner, a decompressed space having an air pressure lower than the atmospheric pressure is established in the space between the cylinder member 44 and the piston 34. The decompressed space allows the atmospheric pressure to act on the piston member 32 toward the bottom of the cylinder body 45. In this manner, an attractive force acts on the piston member 32 to draw the piton member 32 toward the bottom of the cylinder body 45.

Figure 12:
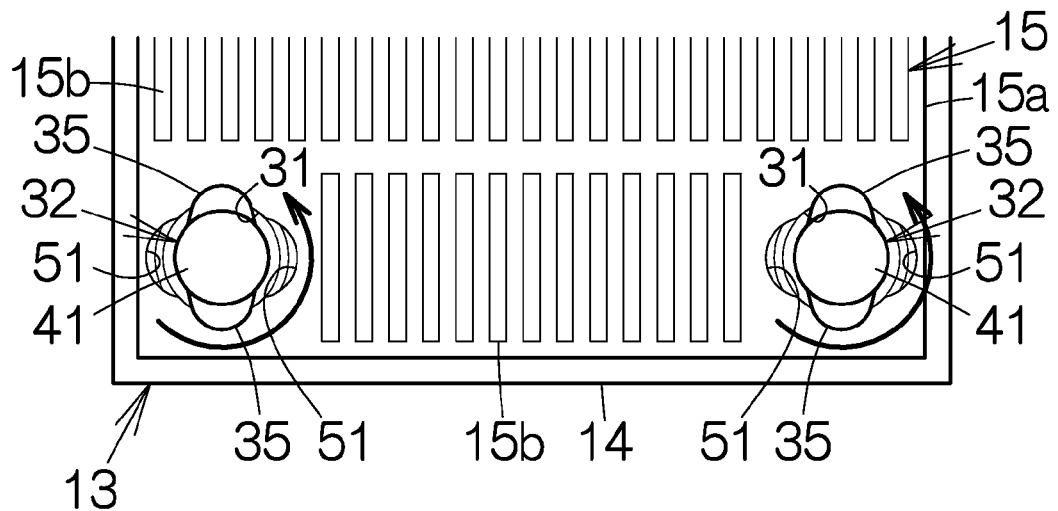
FIG. 12 is a partial plan view, corresponding to FIG. 7, schematically illustrating the protrusions after being rotated received on the upper surface of the base plate.
Figure 13:
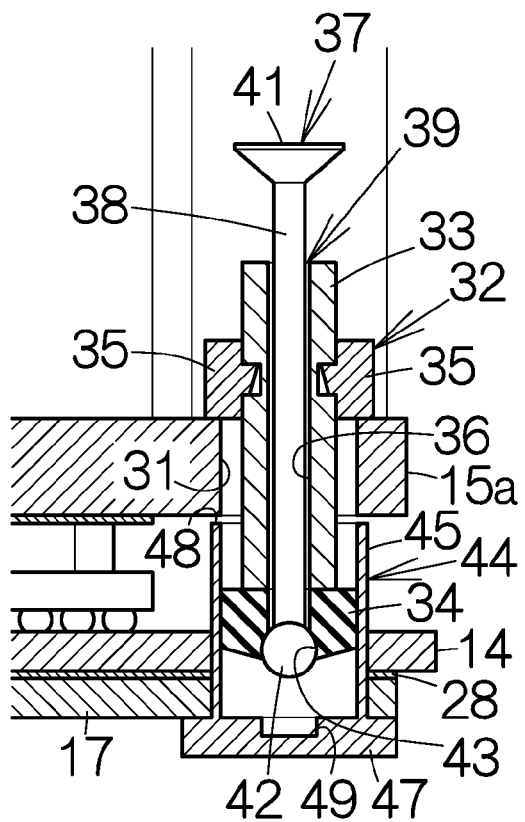
FIG. 13 is a partial sectional view, corresponding to FIG. 4, schematically illustrating the protrusions received on the upper surface of the base plate so that a decompressed space is established.

As depicted in FIG. 12, the protrusions 35, 35 are then driven to rotate around the longitudinal axis of the shaft 33 by a rotation angle of 90 degrees, for example, for a shift from the predetermined pivotal position. The protrusions 35, 35 are moved out of the depressions 51, 51, respectively. As depicted in FIG. 13, the protrusions 35, 35 are urged against the upper surface of the base plate 15a based on the attractive force acting on the piston member 32. The attractive force generates an urging force of the base plate 15a against the LSI chip package 18. The base plate 15a is thus urged against the LSI chip package 18. The foregoing operation is performed for the individual coupling mechanism 16 to attach the heat sink 15. The heat sink 15 is in this manner coupled to the printed wiring board 14.

Here, the urging force of the piston member 32, namely a load F, is preferably set at a predetermined value. The load F may be calculated by multiplying the atmospheric pressure P and the cross-sectional area S of the decompressed space established inside the cylinder member 44. The cross-sectional area S is defined within an imaginary plane perpendicular to the longitudinal axis of the cylinder member 44. The urging force applied from the base plate 15a toward the LSI chip package 18 is the total of the urging forces of the four coupling mechanisms 16. Accordingly, the individual coupling mechanism 16 may exhibit one quarter of an urging force required to urge the base plate 15a. The cross-sectional area S may be adjusted to allow the individual coupling mechanism 16 to exhibit one quarter of the urging force.

Alternatively, the urging force of the piston member 32, namely the load F, may be set based on the distance between the lower end of the piston 34 and the protrusions 35, 35. The protrusions 35, 35 are received on the upper surface of the base plate 15a as described above. The distance is set constant between the base plate 15a and the printed wiring board 14. A change in the distance between the protrusions 35, 35 and the lower end of the piston 34 leads to a change in the volume of the decompressed space defined between the piston 34 and the bottom of the cylinder body 45. A reduction in the distance between the protrusions 35, 35 and the lower end of the piston 34 leads to an increase in the volume of the decompressed space, for example. This results in an increase in the load F. Accordingly, the distance may be adjusted between the protrusions 35, 35 and the lower end of the piston 34 to set the load F.

Figure 14:
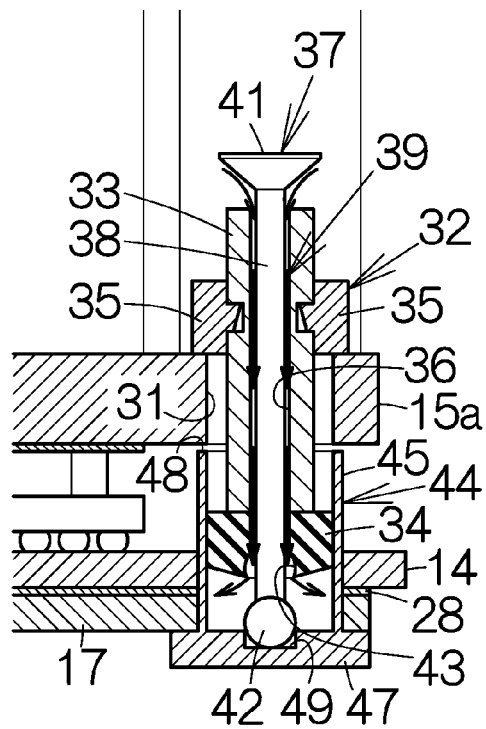
FIG. 14 is a partial sectional view, corresponding to FIG. 4, schematically illustrating that the stopple member is pushed down to the lowermost position when a shaft and the piston are fixed.
Figure 15:
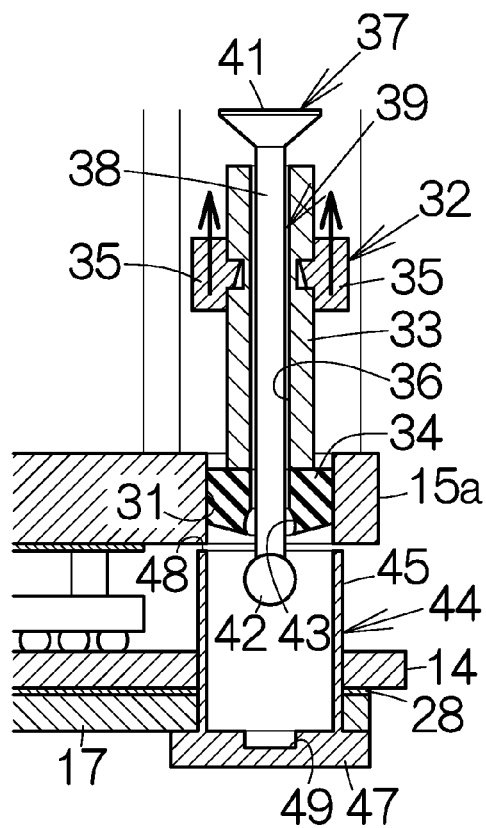
FIG. 15 is a partial sectional view, corresponding to FIG. 4, schematically illustrating the piston member to be detached from the cylinder member.

Next, description will be made on a method of detaching the heat sink 15. The stopple member 37 is first pushed down to the lowermost position. Since the protrusions 35, 35 of the shaft 33 are received on the upper surface of the base plate 15a, the spherical stopple 42 drops out of the depression 43 of the piston 34, as depicted in FIG. 14. The air passage 39 is thus opened. Since the decompressed space is established inside the cylinder body 45, air flows into the decompressed space from the air passage 39. The air pressure inside the cylinder body 45 becomes the atmospheric pressure. When the shaft 33 is lifted up along its longitudinal axis, as depicted in FIG. 15, the piston member 32 is separated from the cylinder member 44. The piston member 32 is pulled out of the through hole 31. The heat sink 15 is in this manner uncoupled from the printed wiring board 14.

In the system board unit 13, the coupling mechanisms 16 are utilized to couple the heat sink 15 to the printed wiring board 14. The piston member 32 of the coupling mechanism 16 is received in the cylinder member 44 through the opening 48 of cylinder member 44. The decompressed space is thus established. The cylinder member 44 is fixed to the bolster plate 17. The decompressed space generates the attractive force to act on the piston member 32 to the cylinder member 44. An urging force is thus applied to the LSI chip package 18 from the base plate 15a of the heat sink 15. The heat sink 15 is thus attached to or detached from the printed wiring board 14 in a relatively facilitated manner without any tool.

Figure 16:
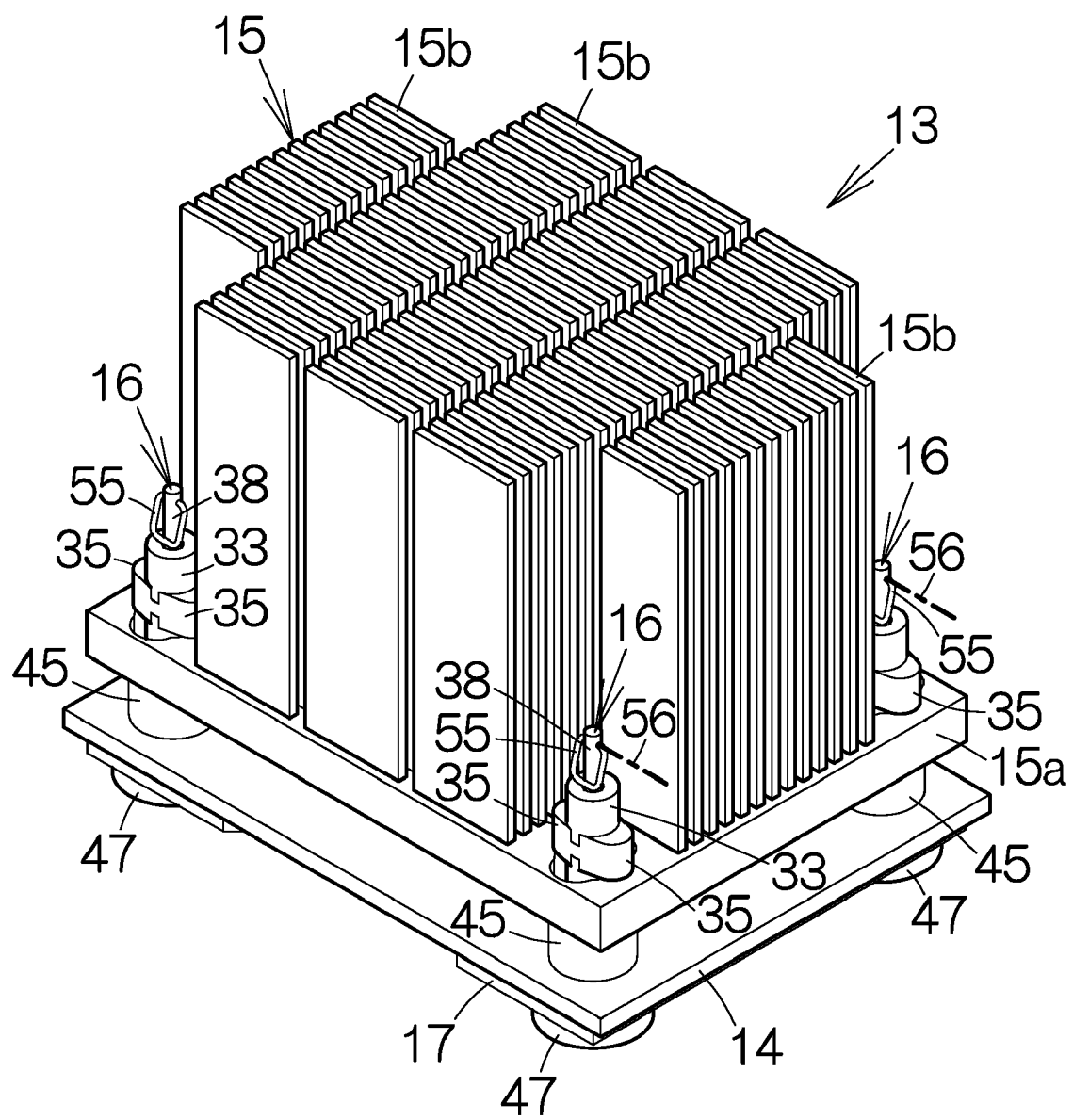
FIG. 16 is a perspective view schematically illustrating a system board according to a modified embodiment.

As depicted in FIG. 16, a ring 55 may be attached to the upper end of the pin 38 of the individual piston member 32 in place of the flange 41. The ring 55 is shaped in a rectangular frame, for example. The frame is coupled to the upper end of the pin 38 at one side of the rectangle. The ring 55 is swingable relative to the pin 38 around a horizontal axis 56 perpendicular to the longitudinal axis of the pin 38. The width of the frame may be set smaller than the interval between the opposite ends of the protrusions 35, 35. Like reference numerals are attached to the structure or components equivalent to those of the aforementioned embodiment. The ring 55 contributes to facilitation of the hold of the stopple member 37.

The system board unit 13 can be incorporated not only in the server computer 11 but also in various kinds of electronic apparatuses. In the system board unit 13, the cylinder members 44 and the bolster plate 17 may be formed in a one piece component, for example. In this case, the one piece component of the cylinder members 44 and the bolster plate 17 may be cast out of a metallic material.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification relate to a depicting of the superiority and inferiority of the invention. Although the embodiments of the present inventions have been described in detail, it should be understood that the various changes, substitutions, and alterations could be made hereto without departing from the spirit and scope of the invention.

What is claimed is:

1. An electronic component unit comprising:
   a substrate;
   an electronic component provided on a surface of the substrate;
   a heat dissipating member provided on the electronic component;
   a cylinder member having one end coupled to the substrate, the cylinder member having an other end defining an opening opposed to the heat dissipating member;
   a piston member having one end inserted in the cylinder member through the opening, the one end of the piston member establishing an airtight space inside the cylinder member, the piston member including a protrusion, the piston member being movable to increase a volume of the airtight space, to a position where the protrusion is to be coupled to the heat dissipating member, so that the airtight space is decompressed to have an air pressure lower than that of outside of the cylinder member;
   a through hole penetrating the piston member along a longitudinal axis of the piston member, the through hole connecting the airtight space and the outside of the cylinder member; and
   a stopple member inserted in the through hole from one end of the through hole, the stopple member keeping an air passage around the stopple member inside the through hole, the stopple member configured to move along the longitudinal axis of the piston member to open and close the airtight space at an other end of the through hole.

2. The electronic component unit according to claim 1, further comprising:
   a through hole formed in the heat dissipating member, the through hole receiving the piston member therein,
   the protrusion received on the heat dissipating member outside the through hole.

3. The electronic component unit according to claim 1, further comprising:
   a plate member overlaid on a back surface of the substrate, the plate member including a portion corresponding to the cylinder member; and
   a through hole formed in the substrate, the through hole receiving the cylinder member therein.

4. The electronic component unit according to claim 1, wherein the piston member comprising:
   a piston fitted in the cylinder member to establish the airtight space;
   a shaft connected to the piston, the shaft extending through a through hole formed in the heat dissipating member; and
   a ring rotatable around the shaft, the ring holding the protrusion for pivotal movement of the protrusion around the shaft at least between a first pivotal position and a second pivotal position, wherein
   the protrusion at the first pivotal position is coupled to the heat dissipating member, a groove is formed in an inner wall surface of the through hole, the protrusion at the second pivotal position passes through the through hole along the groove.

5. An electronic apparatus comprising an electronic component unit, said electronic component unit comprising:
   a substrate;

an electronic component provided on a surface of the substrate;

a heat dissipating member provided on the electronic component;

a cylinder member having one end coupled to the substrate, the cylinder member having an other end defining an opening opposed to the heat dissipating member;

a piston member having one end inserted in the cylinder member through the opening, the one end of the piston member establishing an airtight space inside the cylinder member, the piston member including a protrusion, the piston member being movable to increase a volume of the airtight space, to a position where the protrusion is to be coupled to the heat dissipating member, so that the airtight space is decompressed to have an air pressure lower than that of outside of the cylinder member;

a through hole penetrating the piston member along a longitudinal axis of the piston member, the through hole connecting the airtight space and the outside of the cylinder member; and a stopple member inserted in the through hole from one end of the through hole, the stopple member keeping an air passage around the stopple member inside the through hole, the stopple member configured to move along the longitudinal axis of the piston member to open and close the airtight space at an other end of the through hole.

* * * * *